United States Patent [19]

Okuda et al.

[11] Patent Number: 5,510,639
[45] Date of Patent: Apr. 23, 1996

[54] NON-VOLATILE SEMICONDUCTOR MEMORY HAVING A RING-SHAPED FLOATING GATE

[75] Inventors: Yasushi Okuda, Takatsuki; Yoshinori Odake, Katano; Ichiro Nakao, Kadoma; Youhei Ichikawa, Yokohama, all of Japan

[73] Assignee: Matsushita Electric Industrial Co., Ltd., Osaka, Japan

[21] Appl. No.: 384,791

[22] Filed: Feb. 9, 1995

Related U.S. Application Data

[63] Continuation of Ser. No. 189,970, Feb. 1, 1994, abandoned.

[30] Foreign Application Priority Data

Feb. 2, 1993 [JP] Japan .................... 5-015191

[51] Int. Cl.[6] ................ H01L 29/788; H01L 29/76
[52] U.S. Cl. ................ 257/317; 257/316; 257/401
[58] Field of Search ................ 257/315, 316, 257/317, 490, 401

[56] References Cited

U.S. PATENT DOCUMENTS

| | | | |
|---|---|---|---|
| 4,290,077 | 9/1981 | Ronen | 257/401 |
| 4,561,168 | 12/1985 | Pitzer et al. | 257/401 |
| 4,845,539 | 7/1989 | Inoue . | |
| 4,990,980 | 2/1991 | Wada . | |
| 5,053,842 | 10/1991 | Kojima . | |

FOREIGN PATENT DOCUMENTS

| | | |
|---|---|---|
| 0081269 | 6/1983 | European Pat. Off. . |
| 0262853 | 4/1988 | European Pat. Off. . |
| 61-290767 | 12/1986 | Japan . |
| 3-132079 | 6/1991 | Japan . |
| 3-187272 | 8/1991 | Japan . |
| 4-079369 | 3/1992 | Japan . |

OTHER PUBLICATIONS

EPO Search Report (94101463.1) dated Dec. 15, 1994.

*Primary Examiner*—Ngân V. Ngô
*Attorney, Agent, or Firm*—Ratner & Prestia

[57] ABSTRACT

A non-volatile semiconductor memory cell having a novel structure is provided. The memory cell has a ring-shaped channel region formed on a semiconductor substrate, a drain region formed in a zone surrounded by the channel region, and a source region formed outside the channel region. The cell further includes a first gate insulation layer formed on the substrate in such a manner as to cover the boundary between the channel region and the drain region, a ring-shaped floating gate electrode formed on the first gate insulation layer, a second gate insulation layer formed on the floating gate electrode; and a control gate electrode which is capacitive-coupled with the floating gate via the second gate insulation layer.

13 Claims, 8 Drawing Sheets

NON-VOLATILE SEMICONDUCTOR MEMORY HAVING A RING-SHAPED FLOATING GATE

This application is a continuation of application Ser. No. 08/189,970 filed Feb. 1, 1994, now abandoned.

BACKGROUND OF THE INVENTION

1. Field of the Invention

The present invention relates to a non-volatile semiconductor memory device and a method for fabricating the same.

2. Description of the Related Art

Figure 11:
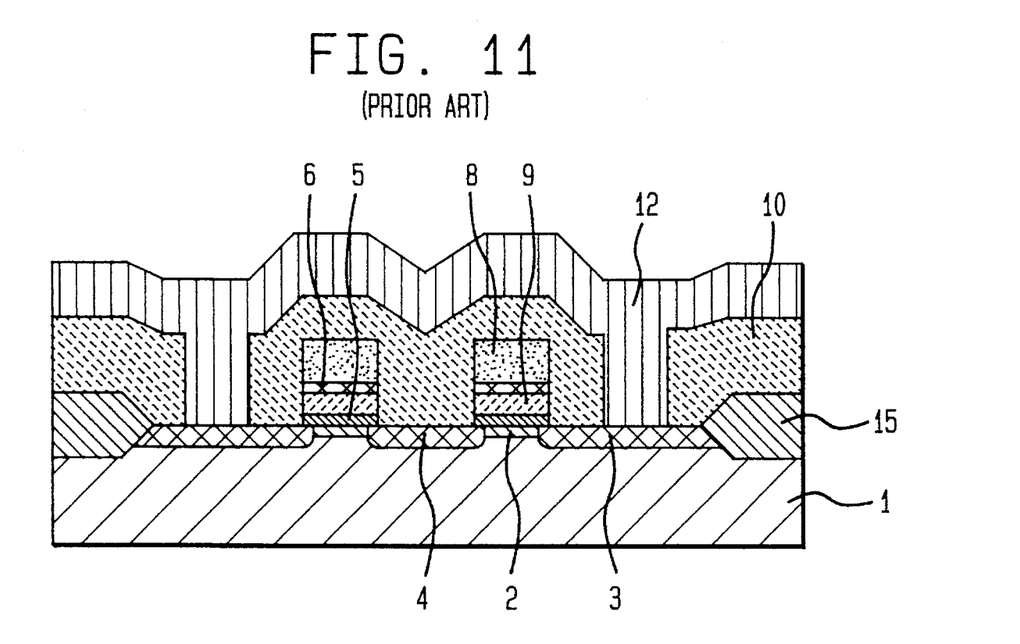
FIG. 11 is a cross sectional view illustrating a non-volatile semiconductor memory device (flash EEPROM) of the prior art.

Electrically Programmable Read Only Memory (EPROM) and Electrically Erasable Programmable Read Only Memory (EEPROM) are widely used as non-volatile semiconductor memory devices. FIG. 11 shows a cross sectional view of a part of a flash type EEPROM of the prior art. Each memory cell transistor of the EEPROM has a channel region (p-type diffusion layer) 2, n-type drain region 3 and source region 4 formed in a p-type silicon substrate 1. Further, each memory cell transistor has a control gate electrode 8 formed on the silicon substrate 1 and a floating gate electrode 9 formed on the control gate electrode 8. A first gate insulation film 5 is provided between the floating gate electrode 9 and the silicon substrate 1, and a second gate insulation film 6 is provided between the floating gate electrode 9 and the control gate electrode 8. These electrodes 8 and 9 are covered by a silicon oxide film 10. Bit lines 12 run over the silicon oxide film 10 so as to interconnect the drain region 3 with drain regions of the other transistors via contact holes provided in the silicon oxide film 10.

While FIG. 11 shows a non-volatile semiconductor memory cell of the non-volatile semiconductor memory device, in fact there exist a large number of memory cells on the silicon substrate 1. The memory cells are electrically isolated from each other by an element isolation film 15 such as LOCOS (Local Oxidation) formed in a prescribed region of the silicon substrate 1.

Storage of information in the non-volatile semiconductor memory device is achieved by storing/unstoring a positive or negative charge in the floating gate electrode 9. Because the positive or negative charge stored in the floating gate electrode 9 affect the threshold voltage (Vt) of the transistor of the memory cell, stored information can be read out by detecting the drain current of the transistor.

The prior art described above has problems which are described below.

When injecting or releasing the positive or negative charge to or from the floating gate electrode 9, relatively high voltages are applied to the control gate electrode 8 and the bit lines 12. Therefore a structure of word line (control gate electrode 8)/element isolation film 15/silicon substrate 1 functions as a parasitic MOS structure formed between adjacent memory cells and, as a result, a conduction channel may be formed between the adjacent memory cells. Such a conduction channel breaks the isolation between the adjacent memory cells. In order to maintain the element isolation, it is necessary to make the element isolation film 15 thicker and wider, which is incompatible with the aim of achieving a large scale integration of memory transistors.

Also it is generally necessary to increase the operating current (for example the drain current) of the transistor to increase the speed of reading data. However, reduction of the channel width of the transistor for the purpose of scaling down the size of the semiconductor memory leads to a decrease in the operating current.

Further, in the constitution as described above, the inversion threshold voltages of memory cell transistors are likely to fluctuate due to the fluctuation of the amount of the stored charges in the floating gate electrode. For this reason, it is necessary to write all data in batch before making an erasing operation (or a writing operation), or repeating the erasing operation and checking of the threshold voltage (Vt). This checking operations are called as "verifying operations" and increase the time taken in erasure or writing.

SUMMARY OF THE INVENTION

The non-volatile semiconductor memory cell of this invention, comprises a semiconductor substrate of a first conductive type, the semiconductor substrate having a top surface; a ring-shaped channel region of the first conductive type formed on the top surface of the semiconductor substrate; a drain region of a second conductive type formed in a zone surrounded by the ring-shaped channel region on the top surface of the semiconductor substrate; a source region of the second conductive type formed outside the ring-shaped channel region on the top surface of the semiconductor substrate; a first gate insulation layer formed on the top surface of the semiconductor substrate in such a manner as to cover the boundary between the ring-shaped channel region and the drain region; a ring-shaped floating gate electrode formed on the first gate insulation layer; a second gate insulation layer formed on the ring-shaped floating gate electrode; and a control gate electrode which is capacitive-coupled with the ring-shaped floating gate electrode via the second gate insulation layer, and is electrically insulated from the semiconductor substrate.

In one embodiment, the control gate electrode covers a top surface of the ring-shaped floating gate electrode.

In one embodiment, the ring-shaped floating gate electrode covers at least a part of a top surface and an inner side surface of an opening of the control gate electrode.

In one embodiment, the ring-shaped floating gate electrode is a side wall provided on an inner side surface of an opening of the control gate electrode.

In one embodiment, the cell further comprises a third gate insulation layer formed on the top surface of the semiconductor substrate in such a manner as to cover the boundary between the ring-shaped channel region and the source region to provide insulating isolation between the semiconductor substrate and the control gate electrode, wherein the control gate electrode is opposed to the boundary via the third gate insulation film.

In one embodiment, the first gate insulation film is thinner than the third gate insulation film.

The non-volatile semiconductor memory device of this invention, comprises: a semiconductor substrate of a second conductive type, the semiconductor substrate having a top surface; a memory cell array region provided on the top surface of the semiconductor substrate; a plurality of non-volatile memory cells arranged in the memory cell array region; and word lines and bit lines to provide interconnection between the plurality of non-volatile memory cells, wherein each of the plurality of non-volatile memory cells comprises; a ring-shaped channel region of the first conductive type formed on the top surface of the semiconductor substrate; a drain region of a second conductive type formed in a zone surrounded by the ring-shaped channel region on the top surface of the semiconductor substrate; a source region of the second conductive type formed outside the ring-shaped channel region on the top surface of the semiconductor substrate; a ring-shaped first gate insulation layer formed on the top surface of the semiconductor substrate in such a manner as to cover the boundary between the ring-shaped channel region and the drain region; a ring-shaped floating gate electrode formed on the ring-shaped first gate insulation layer; a second gate insulation layer formed on the surface of the ring-shaped floating gate electrode; and a control gate electrode which is capacitive-coupled with the ring-shaped floating gate electrode via the second gate insulation layer, and is electrically insulated from the semiconductor substrate, wherein at least part of the plurality of non-volatile memory cells share the source region, and each of the plurality of word lines includes the control gate electrode in part thereof.

In one embodiment, the control gate electrode covers the top surface of the ring-shaped floating gate electrode.

In one embodiment, the ring-shaped floating gate electrode covers at least a part of a top surface and an inner side surface of an opening of the control gate electrode.

In one embodiment, the ring-shaped floating gate electrode is a side wall provided on an inner side surface of the opening of the control gate electrode.

In one embodiment, the cell further comprises a third gate insulation layer formed on the top surface of the semiconductor substrate in such a manner as to cover the boundary between the ring-shaped channel region and the source region to provide insulating isolation between the semiconductor substrate and the control gate electrode, wherein the control gate electrode is opposed to the boundary via the third gate insulation film.

In one embodiment, no element isolation region to isolate the memory cells is provided in the memory cell array region.

In one embodiment, an insulation film is provided between part of each of the plurality of word lines other than the control gate electrode and the semiconductor substrate, and the insulation film is thicker than the third gate insulation film.

The method of fabricating a non-volatile semiconductor memory device of this invention, comprising the steps of: forming a diffusion layer of a second conductive type which is to become a source region on a top surface of a semiconductor substrate of a first conductive type; forming a first insulation layer which is to become a third gate insulation layer on the semiconductor substrate; depositing a first conductive layer which is to become the control gate electrode on the first insulation layer; patterning the first conductive layer and the first insulation layer and thereby obtaining the external configuration of the control gate electrode; depositing a second insulation layer on the semiconductor substrate so as to cover the patterned first conductive layer; making an opening in the first conductive layer, the first and the second insulation layers, and thereby exposing a part of the semiconductor substrate and forming the third gate insulation layer from the first insulation layer; forming a diffusion layer of a first conductive type which is to become a channel region in the part of the semiconductor substrate exposed via the opening; forming a first gate insulation layer on the semiconductor substrate in the opening and forming a second gate insulation layer on the first conductive layer; forming a ring-shaped floating gate electrode on the first gate insulation layer; and doping an impurity of a second conductive type in a part of the diffusion layer of the first conductive type via the opening, thereby to form a diffusion layer of the second conductive type which is to become a drain region.

In one embodiment, the step of forming the ring-shaped floating gate electrode comprises the steps of; depositing a second conductive film which is to become the ring-shaped floating gate electrode on the semiconductor substrate; and etching back the second conductive film by an anisotropic etching process to leave a part of the second conductive layer remaining on the inner wall surface of the opening of the first conductive layer and thereby forming the ring-shaped floating gate electrode.

In one embodiment, the method further comprises a step of forming a side wall insulation layer on the inner side surface of the ring-shaped floating gate electrode after forming the diffusion layer of the second conductive type which is to become the drain region.

In one embodiment, the first gate insulation layer and the second gate insulation layer are formed at the same time by thermal oxidation.

The method of fabricating a non-volatile semiconductor memory device of the invention, comprising the steps of: forming a diffusion layer of a first conductive type which is to become a channel region on a top surface of a semiconductor substrate of a first conductive type; forming a first insulation layer which is to become a first gate insulation layer on the semiconductor substrate; depositing a first conductive film which is to become a floating gate electrode on the first insulation layer; patterning the first conductive film and the first insulation layer and thereby to obtain the external configuration of the floating gate electrode; forming a second gate insulation layer on the patterned first conductive film and forming a third gate insulation layer on the semiconductor substrate; depositing a second conductive layer on the semiconductor substrate so as to cover the patterned first conductive layer; depositing a second insulation layer on the semiconductor substrate so as to cover the patterned first conductive film; patterning the second insulation layer, the second conductive layer, the first conductive layer and the first insulation layer, and thereby to obtain a ring-shaped floating gate electrode having an opening and a control gate electrode; and doping a second conductive impurity in the semiconductor substrate by using the control gate electrode as a mask, and thereby forming a source region and a drain region.

In one embodiment, the method further comprises a step of forming a side wall insulation layer on the inner side surfaces of the openings of the ring-shaped floating gate electrode and of the control gate electrode, after forming the source region and the drain region.

In one embodiment, the second gate insulation layer and the third gate insulation layer are formed at the same time by thermal oxidation.

Thus, the invention described herein makes possible the advantages of (1) providing a non-volatile semiconductor memory device wherein electrical isolation between adjacent memory cell transistors is secured and the memory cells can be made extremely small and packaged in a high degree of integration, and to provide a method of fabricating thereof, and (2) providing a non-volatile semiconductor memory device having an increased rate of reading and reduced time taken in deletion, and a method of fabricating thereof.

These and other advantages of the present invention will become apparent to those skilled in the art upon reading and understanding the following detailed description with reference to the accompanying figures.

DESCRIPTION OF THE PREFERRED EMBODIMENTS

Example 1

A first example of a non-volatile semiconductor memory device according to the present invention will now be described below with reference to FIGS. 1A and 1B, FIG. 2 and FIG. 3. These figures show part of a memory cell array region of the non-volatile semiconductor memory device.

Figure 3:
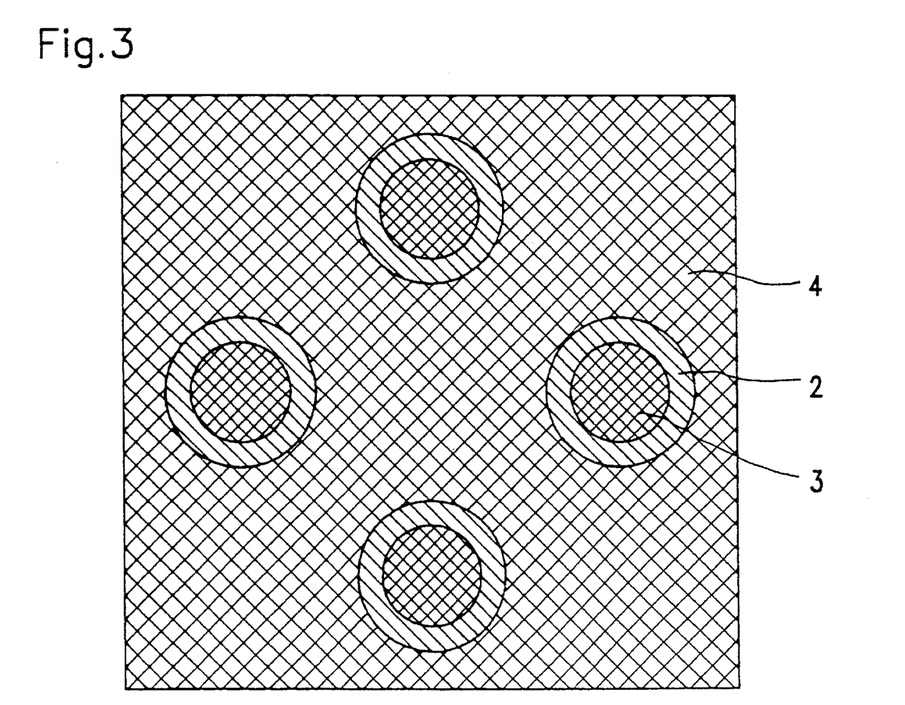
FIG. 3 is a plan view illustrating the layout of the source, channel and drain regions of the non-volatile semiconductor memory device of FIG. 1.

This non-volatile semiconductor memory device uses a silicon substrate 1 of p-type as a semiconductor substrate. The p-type silicon substrate 1 includes a plurality of p-type ring-shaped channel regions 2, a plurality of n-type drain regions (approximately 0.9 μm in diameter) 3 each being surrounded by a ring-shaped channel region 2, and a common n-type source region 4 formed outside the ring-shaped channel region 2, as shown in FIG. 3. In this example, the channel length is set at 0.3 μm and the effective channel width is set at 3.14 (= 0.5×2π) μm.

The non-volatile semiconductor memory device of this example includes such number of non-volatile memory cells (or memory cell transistors) as corresponds to the number of drain regions 3 in the memory cell array region thereof, and includes peripheral circuits such as a drive circuit to drive these non-volatile memory cells in a region not shown in the drawing.

Figure 1A:
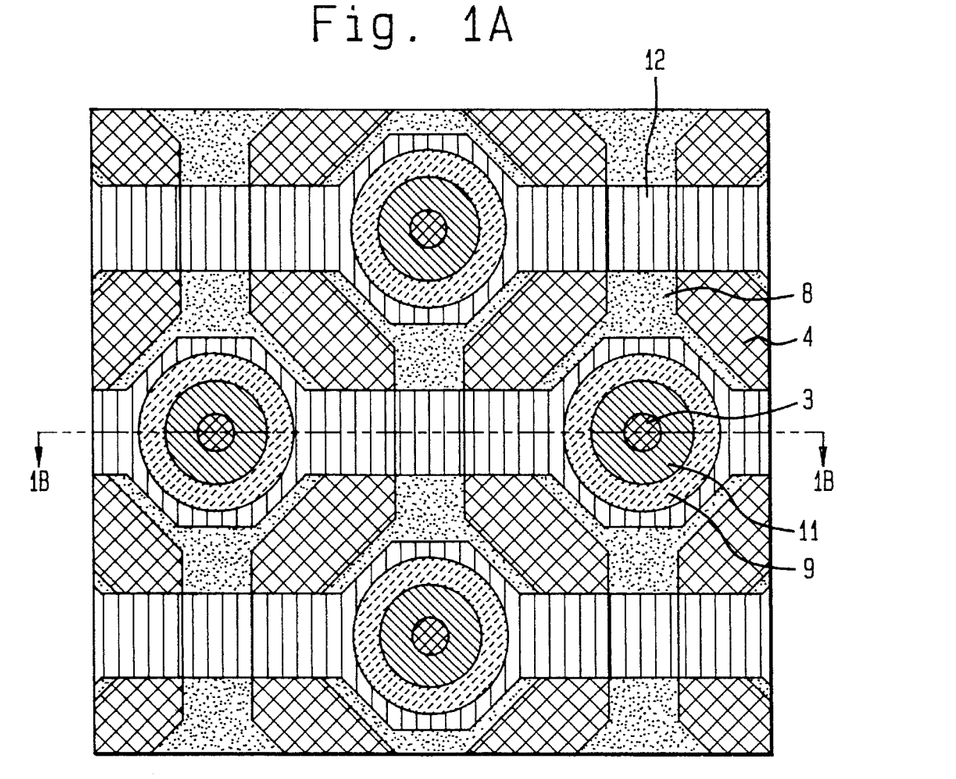
FIG. 1A is a plan view illustrating a non-volatile semiconductor memory device of the invention.
Figure 1B:
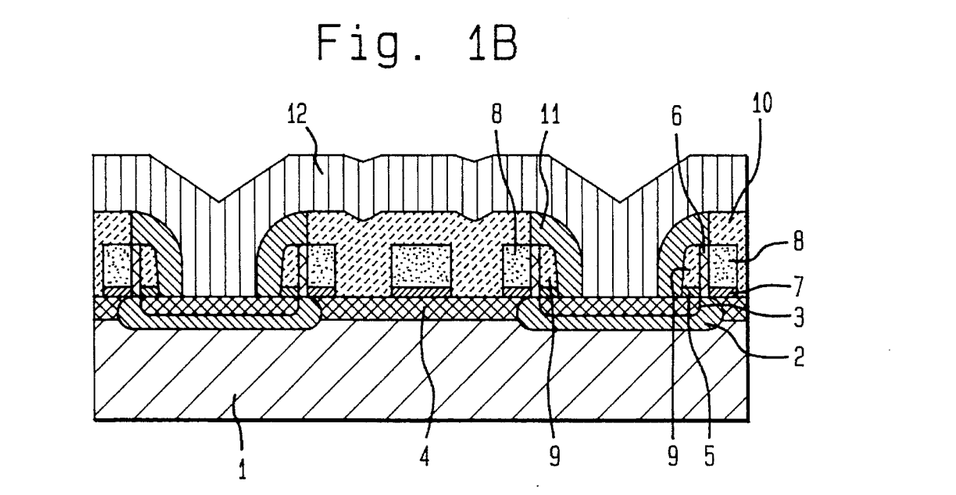
FIG. 1B is a cross sectional view taken along the line 1B—1B in FIG. 1A.

As shown in FIG. 1B, each memory cell transistor includes a ring-shaped first gate insulation layer (10 nm thick) 5 being formed on the top surface of the silicon substrate 1. The ring-shaped first gate insulation layer 5 covers the boundary (pn junction) between the ring-shaped channel region 2 and the drain region 3. Formed on the ring-shaped first gate insulation layer 5 is a ring-shaped floating gate electrode (approximately 200 nm thick measured in parallel to the top surface of the substrate 1) 9. Formed on the external side surface of the ring-shaped floating gate electrode 9 is a second gate insulation layer (20 nm thick) 6.

A control gate electrode 8 is provided on a third gate insulation layer (30 nm thick) formed on the silicon substrate 1. The control gate electrode 8 is insulated from the ring-shaped floating gate electrode 9 by the second gate insulation layer 6. This means that the control gate electrode 8 is capacitive-coupled with the ring-shaped floating gate electrode 9 via the second gate insulation layer 6.

As is shown in FIG. 1B, the pn junction (drain junction) on the top surface of the silicon substrate 1 between the drain region 3 and the channel region 2 is below the first gate insulation film 5, and opposed to the floating gate electrode 9 via the first gate insulation film 5. Similarly, the pn junction (source junction) on the top surface of the silicon substrate 1 between the source region 4 and the channel region 2 is below the third gate insulation film 7, and opposed to the control gate electrode 8 via the third gate insulation film 7. As a result, electric fields from the floating gate electrode 9 and the control gate 8 are effectively applied to the drain junction and the source junction, respectively.

Figure 2:
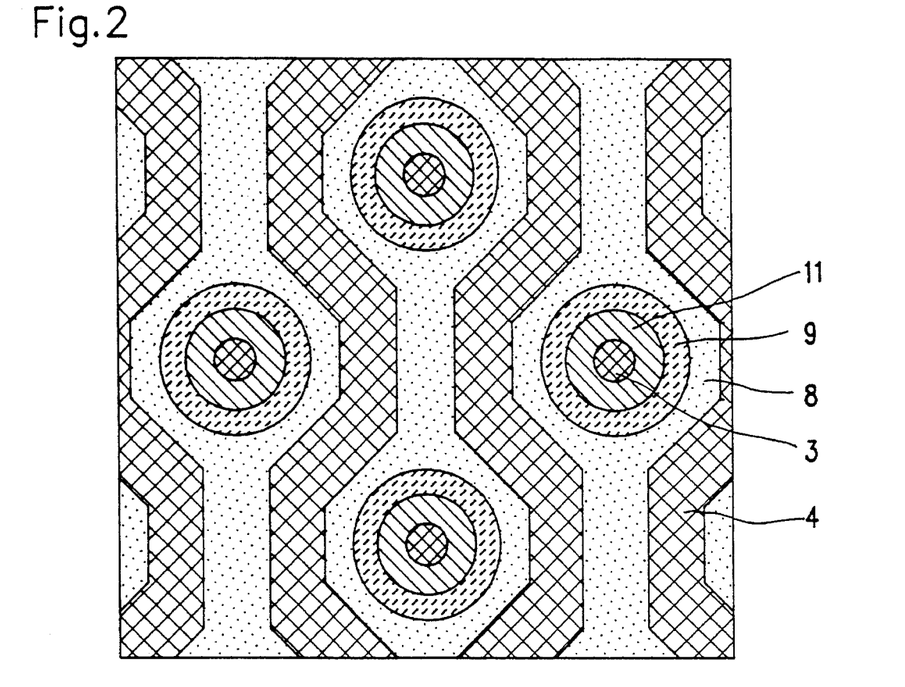
FIG. 2 is a plan view illustrating the layout of the gate electrode of the non-volatile semiconductor memory device of FIG. 1.

FIG. 2 shows the plan layout of the control gate electrode 8, the floating gate electrode 9 and other regions. As can be seen from FIG. 2, the control gate electrode 8 of each non-volatile memory cell is an integral part of the word line and surrounds the periphery of the ring-shaped floating gate electrode 9. As described previously, the second gate insulation layer 6 (not shown in FIG. 2) is provided between the ring-shaped floating gate electrode 9 and the control gate electrode 8 for the purpose of insulating isolation.

A pair of adjacent word lines may be electrically interconnected in a region not shown in FIG. 2 (outside the memory cell array region). In that case, it becomes unnecessary to provide a space between a pair of word lines in the memory cell array region. Therefore, such a plan layout may be employed that every pair of word lines is made a single word line, thereby increasing the degree of integration.

Referring back to FIG. 1B, a silicon oxide film (350 nm thick) 10 is provided on the control gate electrode 8, and the inner side surface of the ring-shaped floating gate electrode 9 is covered by the side wall insulation film (250 nm thick) 11. The silicon oxide film 10 and the side wall insulation film 11 isolate the control gate electrode 8 and the ring-shaped floating gate electrode 9 electrically from bit lines (Line/Space= 0.75 μm/0.75 μm) 12.

The control gate electrode 8 is opposed to the "boundary portion" between the ring-shaped channel region 2 and the source region 4 in FIG. 3. The "boundary portion" corresponds to the portion of a pn junction which locates on the top surface of the silicon substrate 1.

When information is written into the memory cell of the device of this example, the voltages of the bit line 12, the word line, and the silicon substrate 1 are set to be 5 volts, −8 volts, and 0 volts, respectively. When information is erased from the memory cell of the device of this example, the voltages of the bit line 12, the word line, and the silicon substrate 1 are set to be −8 volts, 8 volts, and −8 volts, respectively. In writing/erasing operations, the voltage of the source region 4 is set to be in the floating state. When information is read out from the memory cell of the device of this example, the voltages of the bit line 12, the word line, the silicon substrate 1, and the source region 4 are set to be 1 volts, 3 volts, 0 volts and 0 volts, respectively. In readout operations, the drain current which flows between the source region 4 and drain region 3 is detected.

The constitution described above provides the following effects.

(1) An isolation region (for example the LOCOS region) to isolate the transistors from each other is not necessary. Therefore a large number of transistors can be integrated in a high density in a limited space.

(2) Because the channel width of a transistor is determined by the mean circumferential length of the ring-shaped channel region 2, a relatively large channel width can be obtained for a given area occupied by a transistor.

(3) The electric field effect exerted by the control gate electrode 8 on the ring-shaped channel region 2 can be adjusted with a high degree of accuracy by controlling the thickness of the third gate insulation film 7. As a result, fluctuation of the threshold voltage (Vt) during an erasing operation (or a writing operation) is prevented and the verifying operations is not required.

(4) Because the first gate insulation film 5 can be set thinner than the third gate insulation film 7, electric carriers can pass the first insulation film 5 at a relatively low voltage, thereby enabling it to perform efficient writing/erasing operation. On the other hand, the electric field acting on the third gate insulation film 7 becomes relatively small, thereby preventing the deterioration of the third gate insulation film 7 due to the write/erase operation.

The fabricating method of this example will now be described below with reference to FIGS. 4A through 4E.

Figure 4A:
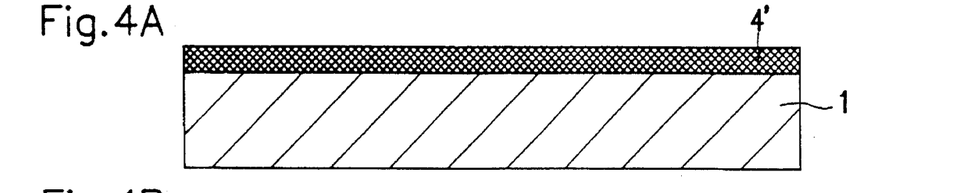
FIGS. 4A through 4E are cross sectional views illustrating the fabrication process for the non-volatile semiconductor memory device of FIG. 1.

First, phosphorous (P) ions are implanted into the memory cell array region of the silicon substrate 1 wherein p-type impurity has been doped at a low concentration, thereby forming an n$^+$ type diffusion layer 4' which is to become an n-type source region 4, as shown in FIG. 4A. Ion implantation may be carried out under conditions of, for example, acceleration energy of 40 keV and dosage of $2 \times 10^{14}$ cm$^{-2}$.

Then the top surface of the silicon substrate 1 is thermally oxidized, for example, by pyro-oxidization at 900° C., to form an oxide film (30 nm thick) 7' which is to become the third gate insulation film 7 on the top surface of the silicon substrate 1. After depositing a polycrystalline silicon (polysilicon) film 8' with a thickness of 350 nm on the oxide film 7' by a CVD method, an impurity (for example phosphorous) is doped in the polycrystalline silicon film 8' to give the polysilicon film 8' a high electrical conductivity.

Figure 4B:
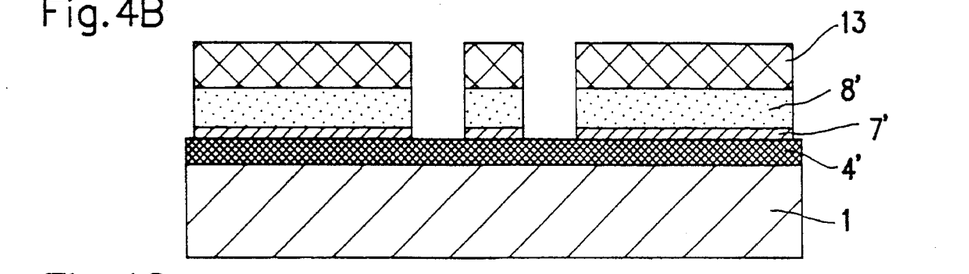

Then a resist layer 13 bearing a pattern to define the configuration and position of the external surface of the control gate electrode 8 is formed on the polysilicon film 8' by means of photolithography techniques. Exposed portions of the polysilicon film 8' and the oxide film 7' are selectively etched away by an anisotropic etching, for example, Reactive Ion Etching (RIE) by using the resist layer 13 as a mask. Thus the external shapes of the control gate electrode (word line) 8 and of the third gate insulation film 7 are formed as shown in FIG. 4B.

After removing the resist layer 13, the silicon oxide film (350 nm thick) 10 is deposited over the entire surface of the silicon substrate 1 to cover the patterned polysilicon film 8'.

Figure 4C:
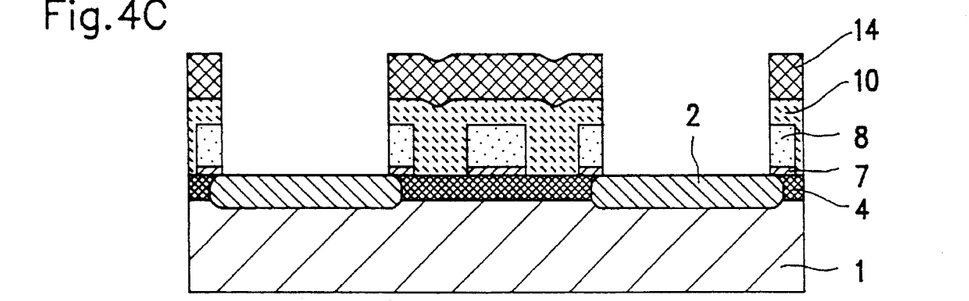

Then a resist layer 14 bearing a pattern to define openings (corresponds to the drain region 3) to be formed in the polysilicon film 8' is formed on the silicon oxide film 10 by means of the photolithography technique. Exposed portions of the silicon oxide film 10 and of the polysilicon film 8' are selectively etched away by an anisotropic etching using the resist layer 14 as a mask, thereby to form openings in the polysilicon film 8' and making the regions of the silicon substrate 1 to become the drain regions 3 exposed.

Thus the control gate electrode 8 covered by the silicon oxide film 10 on the top surface thereof and having the openings is obtained as shown in FIG. 4C.

Then p-type ions are implanted into the exposed portions (a plurality of disk-shaped portions) in the top surface of the silicon substrate 1, thereby forming channel regions (p-type diffusion layer) 2. At this time, the conditions for implanting p-type ion are adjusted so that the thickness of the p-type diffusion layer 2 becomes greater than the thickness of the n$^+$ type diffusion layer 4'. The p-type diffusion layer 2 is formed so as to be connected electrically to the bulk portion of the p-type silicon substrate 1. In order to form the channel region 2, for example, boron ions may be implanted at 50 keV to a dosage of $1 \times 10^{15}$ cm$^{-2}$, followed by implantation of BF$_2$ ions at 40 keV to a dosage of $1 \times 10^{15}$ cm$^{-2}$.

Figure 4D:
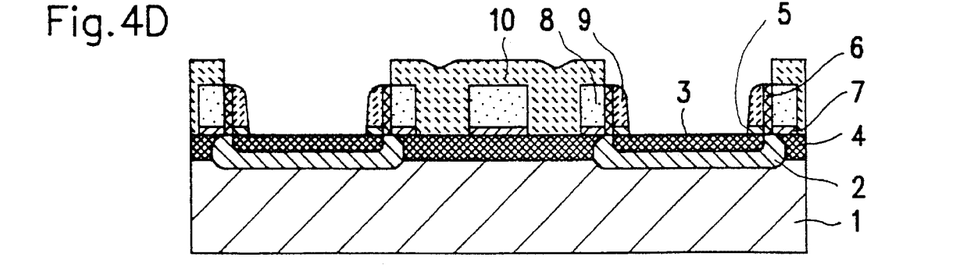

Then the first gate insulation film (10 nm thick) 5 and the second gate insulation film (20 nm thick) 6 are simultaneously formed by thermally oxidizing the exposed surfaces of the silicon substrate 1 and of the gate electrode 8 (pyro-oxidation at 800° C.). This is followed by the deposition of a conductive polysilicon film over the entire surface of the silicon substrate 1 by a CVD method, and by etching-back of the polysilicon film by RIE, thereby forming the ring-shaped floating gate electrode 9 without masking. As shown in FIG. 4D, this etching-back process completely removes the polysilicon film from the surface of the silicon oxide film 10 and, as a result, the ring-shaped floating gate electrodes 9 are electrically isolated from each other. In the opening of the control gate electrode 8, the surface of the p-type diffusion layer 2 is exposed except for the vicinity of the inner wall of the opening.

Then arsenic (As) ions are implanted into the exposed surface of the channel region 2, thereby to form an n$^+$ type drain region 3 in self-alignment with the opening of the control gate electrode 8. The implantation conditions are adjusted so that the layer thickness of the drain region 3 is less than the thickness of the channel region 2. For example, arsenic ions are implanted at 30 keV and dosage of $1 \times 10^{16}$ cm$^{-2}$.

Figure 4E:
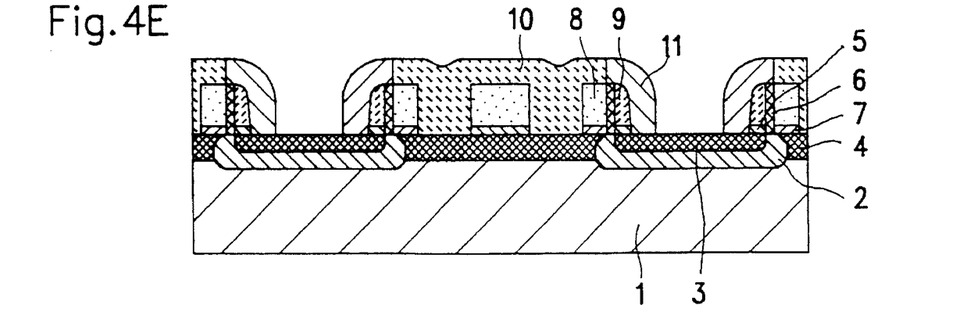

Then after depositing a silicon oxide film (250 nm thick) which is to become a side wall oxide film 11 over the entire surface of the silicon substrate 1 by a CVD method, the silicon oxide film is etched back by an anisotropic etching process, thereby to form the side wall oxide film 11 as shown in FIG. 4E. The side wall oxide film 11 completely covers the inner side surface of the ring-shaped floating gate electrode 9 and has such a slope profile as to maintain stable contact between the drain region 3 and the bit lines 12 (not shown in FIG. 4E).

Then the bit lines 12 as shown in FIGS. 1A and 1B are formed by a metallization process. Each of the bit lines 12 connects a plurality of drain regions of the transistors arranged along the lateral direction in FIG. 1A to peripheral circuits not shown. The bit lines 12 preferably have TiN/Al structure. Alternatively, before making direct contact of the bit lines 12 onto the drain region 3, the opening may be filled with, for example, a high refractory metal structure of W/TiN/Ti.

The method shown in FIGS. 4A through 4E achieves the following effects.

(1) The floating gate electrode 9 and the side wall oxide film 11 are formed in self-alignment with the opening of the control gate electrode 8 by an etching-back process without a masking process. As a result, it becomes unnecessary to perform mask alignment steps in the photolithography process to form the floating gate electrode 9 and the side wall oxide film 11.

(2) The channel length (distance between the source region 4 and the drain region 3) can be controlled by adjusting the thickness of the polysilicon film which is to become the ring-shaped floating gate electrode 9. As a result, the above method enables the making of extremely fine channels beyond the resolution limit of the photolithography.

(3) The size of the drain contact region (the region where each drain region 3 and the corresponding bit line 12 make contact with each other) can be controlled by adjusting the thickness of the silicon oxide film which is to become the side wall oxide film 11. As a result, the above method enables the making of extremely fine drain contact regions beyond the resolution limit of the photolithography.

Example 2

A second example of the non-volatile semiconductor memory device of the invention will be described below with reference to FIG. 5, FIG. 6 and FIG. 7. These drawings show part of the memory cell array region of the non-volatile semiconductor memory device. Components of the second example which correspond to the components of the first example are assigned with the same reference numerals as those of the first example.

The non-volatile semiconductor memory device of this example also uses a p-type silicon substrate 1 for the semiconductor substrate. This example includes a p-type channel region 2 having a plurality of openings, a plurality of n-type drain regions (0.6 μm in diameter) 3 each formed in the opening of the channel region 2, and an n-type source region 4 formed outside the channel region 2, all being formed on the top surface of the semiconductor substrate 1, as most clearly is shown in FIG. 7. While a plurality of source regions 4 are shown as separate from each other in FIG. 5, these source regions 4 may also be continuously formed in a region not shown, so as to be at the same electrical potential.

The non-volatile semiconductor memory device of this example includes such a number of the non-volatile memory cells corresponding to the number of the drain regions 3 in the memory cell array region, as in the first example, and includes peripheral circuits such as a drive circuit to drive these non-volatile memory cells in a region not shown in the drawing.

Figure 5:
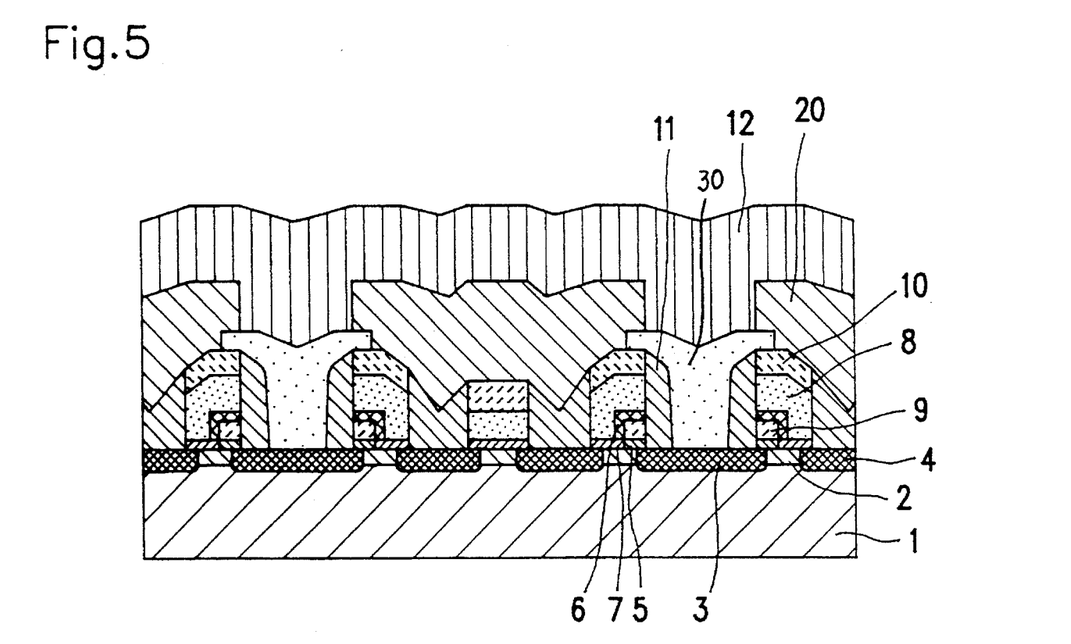
FIG. 5 is a cross sectional view illustrating another non-volatile semiconductor memory device of the invention.

As shown in FIG. 5, the top surface of the silicon substrate 1 has a ring-shaped first gate insulation layer (10 nm thick) 5 being formed thereon to cover the boundary (pn junction) between the channel region 2 and the drain region 3. Formed on the ring-shaped first gate insulation layer 5 is a ring-shaped floating gate electrode (200 nm thick) 9. The ring-shaped floating gate electrode 9 has the second gate insulation layer 6 being formed on the surface thereof.

As shown in FIG. 5, the control gate electrode 8 is provided on the third gate insulation layer 7 and the second gate insulation layer 6 which are formed on the silicon substrate 1. Thus the control gate electrode 8 covers the circumference and the top surface of the ring-shaped floating gate electrode 9 via the second gate insulation layer 6. This means that the control gate electrode 8 is capacitive-coupled with the ring-shaped floating gate electrode 9 via the second gate insulation layer 6.

Figure 6:
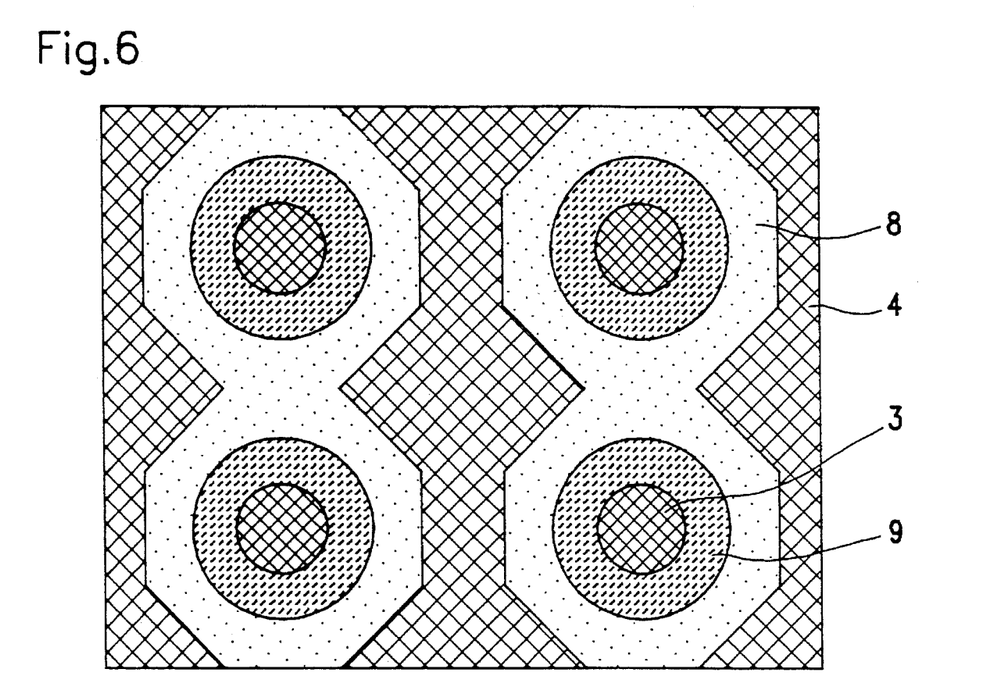
FIG. 6 is a plan view illustrating the layout of the gate electrode of the non-volatile semiconductor memory device of FIG. 5.
Figure 7:
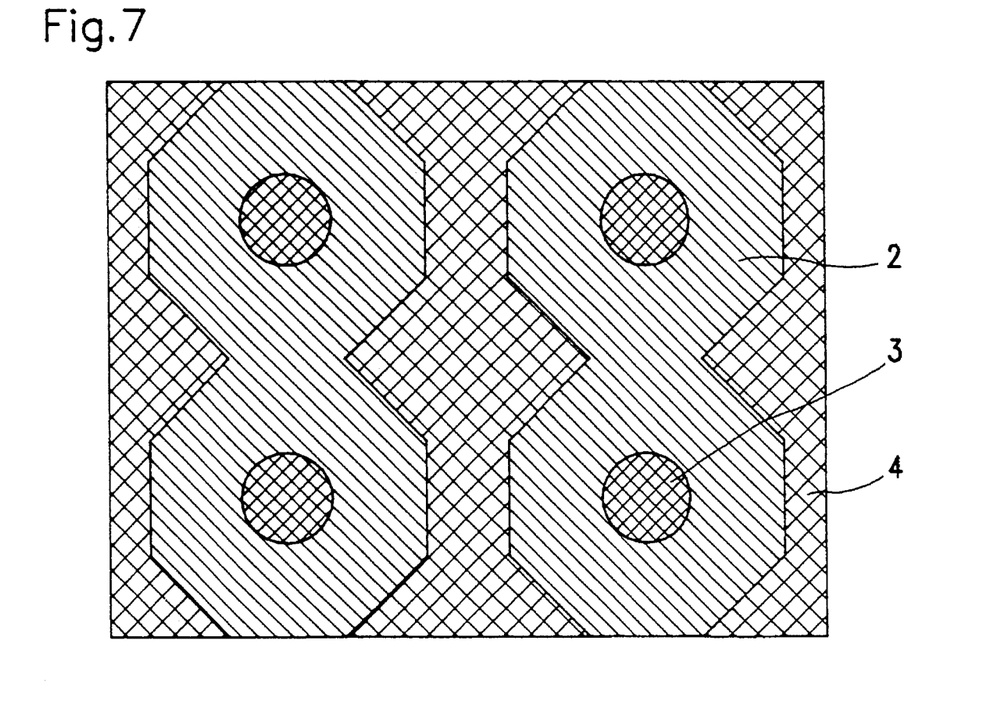
FIG. 7 is a plan view illustrating the layout of the source, channel and drain regions of the non-volatile semiconductor memory device of FIG. 5.

FIG. 6 shows the plan layout of the control gate electrodes 8, the floating gate electrodes 9 and other regions. Each control gate electrode 8 is an integral part of the word line and completely overlaps the ring-shaped floating gate electrode 9. As described previously, the second gate insulation layer 6 (not shown in FIG. 6) is provided between each ring-shaped floating gate electrode 9 and the control gate electrode 8 that surrounds thereof for the purpose of insulating isolation.

Referring back to FIG. 5, a silicon oxide film (350 nm thick) 10 is provided on the control gate electrode 8. The inner side surfaces of the opening of the silicon oxide film 10, the control gate electrode 8 and the ring-shaped floating gate electrode 9 are provided with the side wall insulation film (250 nm thick) 11. As is clearly shown in FIG. 5, the pn junction (drain junction) on the top surface of the silicon substrate 1 between the drain region 3 and the channel region 2 is below the first gate insulation film 5, and opposed to the floating gate electrode 9 via the first gate insulation film 5. Similarly, the pn junction (source junction) on the top surface of the silicon substrate 1 between the source region 4 and the channel region 2 is below the third gate insulation film 7, and opposed to the control gate electrode 8 via the third gate insulation film 7. As a result, electric fields from the floating gate electrode 9 and the control gate electrode 8 are effectively applied to the drain junction and the source junction, respectively.

According to this example, the area of each memory cell is 3 μm$^2$ (2.0 μm×1.5 μm) when the 0.5 μm design rule is employed.

In the non-volatile semiconductor memory device of this example, the control gate electrodes 8 are formed not only on the side wall of the ring-shaped floating gate electrode 9 but also on the top surface thereof. This means that the control gate electrode 8 covers the ring-shaped floating gate electrode 9 and, as a result, the areas of the control gate electrode 8 and the floating gate electrode 9 opposed to each other increase, thereby increasing the degree of the capacitive coupling between thereof. Consequently, it is made possible to lower the write/erase voltage to be applied to the control gate electrode 8.

The fabricating method in this example will now be described below with reference to FIGS. 8A through 8D.

Figure 8A:
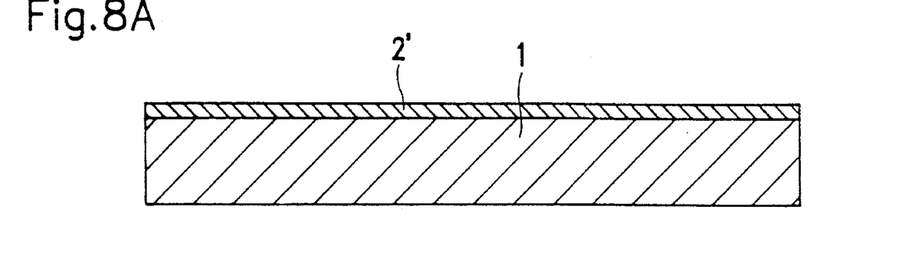
FIGS. 8A through 8D are cross sectional views illustrating the fabrication process for the non-volatile semiconductor memory device of FIG. 5.

First, boron (B) ions are implanted into the entire surface of the memory cell array region of the silicon substrate 1 wherein p-type impurity has been doped at a low concentration, thereby forming a p-type diffusion layer 2' which is to become the channel region 2, as shown in FIG. 8A. Threshold voltage (Vt) of the memory cell transistors is controlled by adjusting the doping level in the surface of the p-type diffusion layer 2'. Part of the p-type diffusion layer 2' also functions later as a punch-through stop. Boron ions are implanted at an acceleration energy of 40 keV to a dosage of 2×10$^{13}$ cm$^{-2}$ for the control of the threshold voltage (Vt), and boron ions to form the punch-through stop are implanted at an acceleration energy of 80 keV to a dosage of 1×10$^{13}$ cm$^{-2}$.

Then the top surface of the silicon substrate 1 is thermally oxidized, for example, by pyro-oxidization at 900° C., to form an oxide film (10 nm thick) 5' which is to become a first gate insulation film 5 on the top surface of the silicon substrate 1. After depositing a polysilicon film (200 nm thick) 9' on the oxide film 5' by a CVD method, an impurity (for example phosphorous) is doped in the polysilicon film 9' to give the polysilicon film 9' a high conductivity.

Figure 8B:
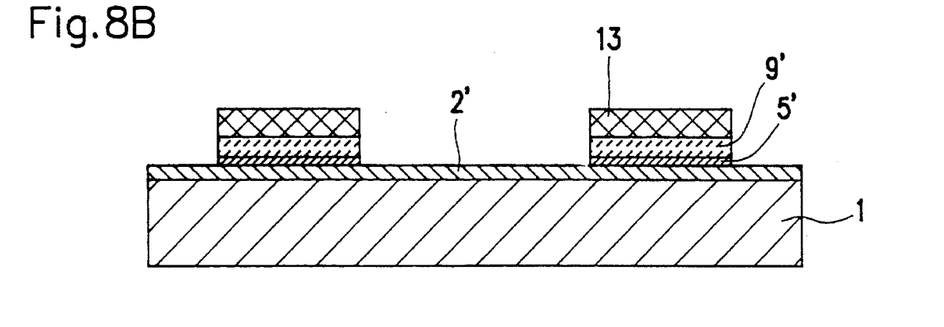

Then a resist layer 13 bearing a pattern to define the configuration and position of the external surface of the floating gate electrode 9 is formed on the polysilicon film 9' by means of photolithography techniques. Exposed portions of the polysilicon film 9' and the oxide film 5' are selectively etched away by an anisotropic etching (for example RIE) using the resist layer 13 as a mask. Thus the floating gate electrode 9 and the first gate insulation film 5 are formed as shown in FIG. 8B.

After removing the resist layer 13, a second insulation layer 6 and a third insulation layer are simultaneously formed on the exposed silicon area by using thermal oxidation. These insulation layers may have an oxide/nitride/ oxide structure with an effective oxide thickness of 25 nm. Then a polysilicon film (250 nm thick) which is to become the control gate electrode 8 and a silicon oxide film (350 nm thick) which is to become the silicon oxide film 10 are deposited over the entire surface of the silicon substrate 1 to cover the floating gate electrode 9.

Figure 8C:
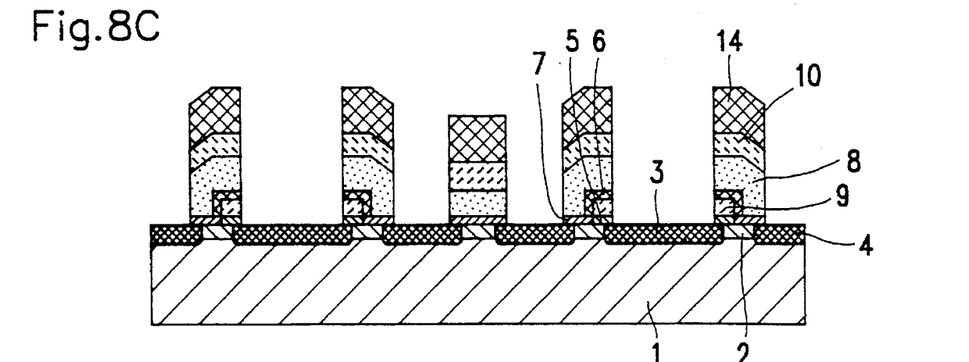

Next, a resist layer 14 bearing a pattern to define the configuration of the control electrode 8 is formed on the silicon oxide film by means of photolithography techniques. Exposed portions of the silicon oxide film and of the polysilicon film are selectively etched away by RIE using the resist layer 14 as a mask, thereby to form the control gate electrode 8 and the silicon oxide film 10 as shown in FIG. 8C (see FIG. 6). This etching process causes the regions of the silicon substrate 1 which are to become the drain region 3 and the source region 4 to be exposed.

Next, arsenic (As) ions are implanted into the exposed portions in the top surface of the silicon substrate 1, thereby to form drain region 3 and the source region 4 in a self-alignment with the control electrode 8. At this time, conditions of implanting arsenic ions are controlled so that the layers of the drain region 3 and the source region 4 are thicker than the p-type diffusion layer 2'. For example, arsenic ions are implanted at 30 keV to a dosage of $4 \times 10^{15}$ cm$^{-2}$. The drain region 3 and the source region 4 have a configurations as shown in FIG. 7.

Figure 8D:
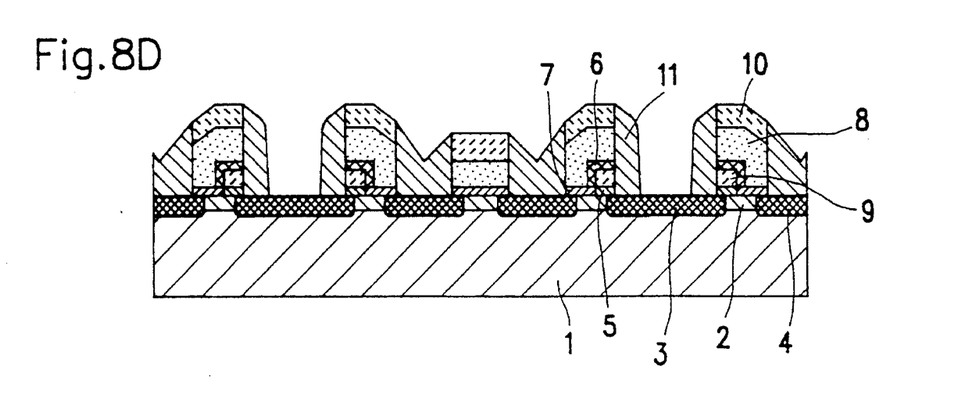

Then after depositing an oxide film over the entire surface of the silicon substrate 1 by a CVD method, the oxide film is etched back by RIE, thereby to form the side wall oxide films 11 on the inner walls of the openings provided in the control gate electrode 8 and in the floating gate electrode 9 and, at the same time, spaces between the control gate electrodes 8 are filled with insulation films. Thus the structure as shown in FIG. 8D is obtained.

Then bit line lead-out electrodes 30 comprising n-type polysilicon film are formed as shown in FIG. 5, followed by the deposition of BPSG (BoroPhospho Silicate Glass) film (600 nm thick) and reflowing at 850° C. for 30 minutes. Then the bit lines 12 as shown in FIG. 5 are formed by the metallization process. Each of the bit lines 12 connects a plurality of drain regions of the transistors arranged along the lateral direction in FIG. 6 and FIG. 7 to the peripheral circuits not shown.

The method shown in FIGS. 8A through 8D provides the following effects.

(1) The drain region 3 and the source region 4 are formed at the same time in self-alignment with the control gate electrode 8.

(2) The pn junction between the drain region 3 and the channel region 2 (drain junction) moves to below the first gate insulation film 5 due to the lateral diffusion and is, as a result, opposed to the floating gate electrode 9 via the first gate insulation film 5.

(3) Similarly, the pn Junction between the source region 4 and the channel region 2 (source junction) moves to below the third gate insulation film 7 due to the lateral diffusion and is, as a result, opposed to the control gate electrode 8 via the third gate insulation film 7.

Example 3

Figure 9:
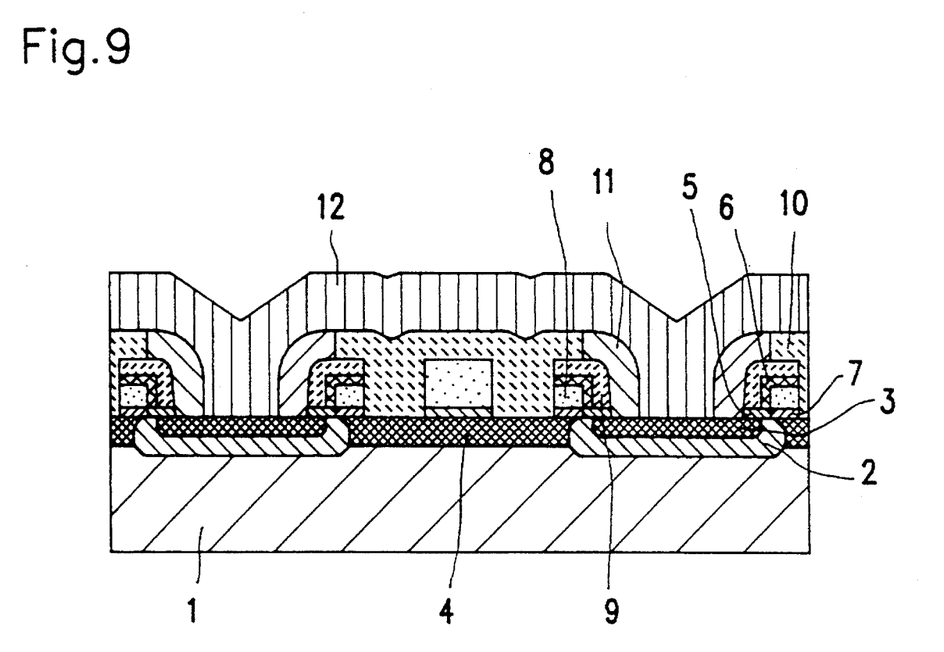
FIG. 9 is a cross sectional view illustrating further another non-volatile semiconductor memory device of the invention.

A third example of the non-volatile semiconductor memory device of the invention will now be described below with reference to FIG. 9. FIG. 9 shows a part of the memory cell array region of the non-volatile semiconductor memory device. Constitution of this example is substantially identical with that of the first example except for the points to be described later. Components of the third example which correspond to the components of the first example are assigned with the same numerals as those of the first example.

Portions of this example different from the first example will be described below.

In the non-volatile semiconductor memory device of this example, the floating gate electrodes 9 are formed not only on the side wall of the ring-shaped control gate electrode 8 but also on the top surface thereof. This means that the control gate electrode 8 is covered by the ring-shaped floating gate electrode 9 and, as a result, the areas of the control gate electrode 8 and the floating gate electrode 9 opposed to each other increase, thereby increasing the degree of capacitive coupling between thereof. Consequently, it is made possible to lower the write/erase voltage to be applied to the control gate electrode 8.

Example 4

Figure 10:
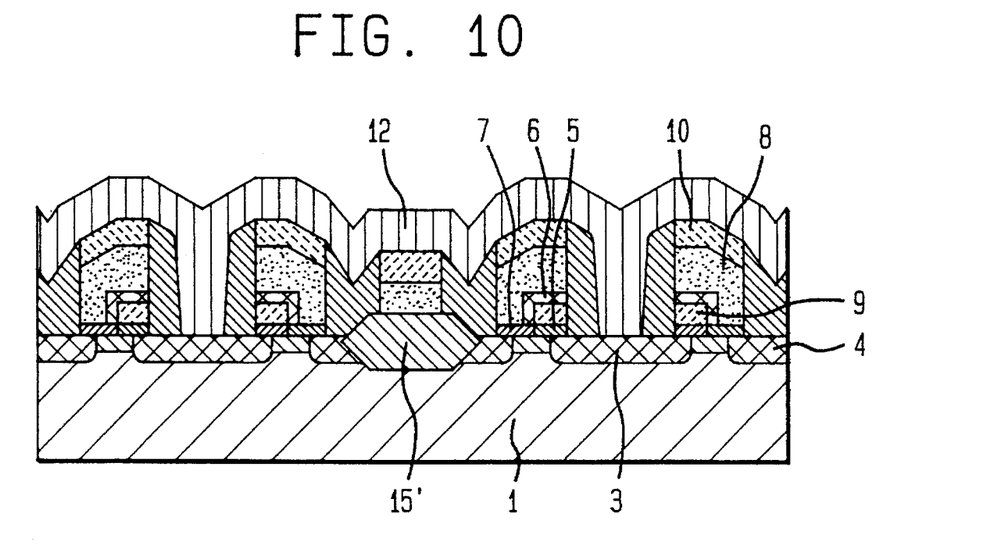
FIG. 10 is a cross sectional view illustrating further another non-volatile semiconductor memory device of the invention.

A fourth example of the non-volatile semiconductor memory device of the invention will now be described below with reference to FIG. 10. FIG. 10 shows a part of the memory cell array region of the non-volatile semiconductor memory device. Constitution of this example is substantially identical with that of the second example except for the points to be described later. Components of the fourth example which correspond to the components of the second example are assigned with the same numerals as those of the second example.

Portions of this example different from the second example will be described below.

In the non-volatile semiconductor memory device of this example, a silicon oxide film 15' is selectively provided below portions of the word lines which do not function as the control gate electrode (namely the wiring portion which interconnects the control gate electrodes 8). Thickness of this silicon oxide film 15' is set to be sufficiently thicker than the first gate insulation film 5 (for example, 100 nm or greater). As a result, the parasitic capacitance between the silicon substrate 1 and the word lines can be reduced. Reduction in the parasitic capacitance in turn results in improved operating speed of the memory device. The silicon oxide film 15' can be formed at the same time when forming the element isolation film (for example LOCOS) in peripheral circuits region not shown in the drawings. This scheme eliminates the need to increase the number of fabrication processes.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory cell comprising:
   a semiconductor substrate of a first conductive type, the semiconductor substrate having a top surface;
   a ring-shaped channel region of the first conductive type embedded in the top surface of the semiconductor substrate;
   a drain region of a second conductive type formed in a zone surrounded by the ring-shaped channel region and embedded in the top surface of the semiconductor substrate;
   a source region of the second conductive type formed outside the ring-shaped channel region and embedded in the top surface of the semiconductor substrate;
   a first gate insulation layer formed on the top surface of the semiconductor substrate in such a manner as to cover the boundary between the ring-shaped channel region and the drain region;
   a ring-shaped floating gate electrode formed from a conductive material on the first gate insulation layer;
   a second gate insulation layer formed on the ring-shaped floating gate electrode; and
   a control gate electrode which is capacitive-coupled with the ring-shaped floating gate electrode via the second gate insulation layer, and is electrically insulated from the semiconductor substrate.

2. A non-volatile semiconductor memory cell according to claim 1, wherein the control gate electrode covers a top surface of the ring-shaped floating gate electrode.

3. A non-volatile semiconductor memory cell according to claim 1, wherein the ring-shaped floating gate electrode covers at least a part of a top surface and an inner side surface of an opening of the control gate electrode.

4. A non-volatile semiconductor memory cell according to claim 1, wherein the ring-shaped floating gate electrode is a side wall provided on an inner side surface of an opening of the control gate electrode.

5. A non-volatile semiconductor memory cell according to claim 1, further comprising a third gate insulation layer formed on the top surface of the semiconductor substrate in such a manner as to cover the boundary between the ring-shaped channel region and the source region to provide insulating isolation between the semiconductor substrate and the control gate electrode, wherein
   the control gate electrode is opposed to the boundary via the third gate insulation film.

6. A non-volatile semiconductor memory device comprising:
   a semiconductor substrate of a first conductive type, the semiconductor substrate having a top surface;
   a memory cell array region provided on the top surface of the semiconductor substrate;
   a plurality of non-volatile memory cells arranged in the memory cell array region; and
   word lines and bit lines to provide interconnection between the plurality of non-volatile memory cells, wherein
   each of the plurality of non-volatile memory cells comprises:
   a ring-shaped channel region of the first conductive type embedded in the top surface of the semiconductor substrate;
   a drain region of a second conductive type formed in a zone surrounded by the ring-shaped channel region and embedded in the top surface of the semiconductor substrate;
   a source region of the second conductive type formed outside the ring-shaped channel region and embedded in the top surface of the semiconductor substrate;
   a ring-shaped first gate insulation layer formed on the top surface of the semiconductor substrate in such a manner as to cover the boundary between the ring-shaped channel region and the drain region;
   a ring-shaped floating gate electrode formed on tile ring-shaped first gate insulation layer;
   a second gate insulation layer formed on the surface of the ring-shaped floating gate electrode; and
   a control gate electrode which is capacitive-coupled with the ring-shaped floating gate electrode via the second gate insulation layer, and is electrically insulated from the semiconductor substrate, wherein
   at least part of the plurality of non-volatile memory cells share the source region, and
   each of the plurality of word lines includes the control gate electrode in part thereof.

7. A non-volatile semiconductor memory cell according to claim 6, wherein the control gate electrode covers the top surface of the ring-shaped floating gate electrode.

8. A non-volatile semiconductor memory cell according to claim 6, wherein the ring-shaped floating gate electrode covers at least a part of a top surface and an inner side surface of an opening of the control gate electrode.

9. A non-volatile semiconductor memory cell according to claim 6, wherein the ring-shaped floating gate electrode is a side wall provided on an inner side surface of the opening of the control gate electrode.

10. A non-volatile semiconductor memory cell according to claim 6, further comprising a third gate insulation layer formed on the top surface of the semiconductor substrate in such a manner as to cover the boundary between the ring-shaped channel region and the source region to provide insulating isolation between the semiconductor substrate and the control gate electrode, wherein
    the control gate electrode is opposed to the boundary via the third gate insulation film.

11. A non-volatile semiconductor memory device according to claim 6, wherein no element isolation region to isolate the memory cells is provided in the memory cell array region.

12. A non-volatile semiconductor memory device according to claim 10, wherein
    an insulation film is provided between part of each of the plurality of word lines other than the control gate electrode and the semiconductor substrate, and
    the insulation film is thicker than the third gate insulation film.

13. A non-volatile semiconductor memory cell according to claim 1, wherein the top surface of the semiconductor substrate is flat.

* * * * *

UNITED STATES PATENT AND TRADE MARK OFFICE
CERTIFICATE OF CORRECTION

PATENT NO.   : 5,510,639
DATED        : April 23, 1996
INVENTOR(S)  : Okuda et al.

It is certified that error appears in the above-identified patent and that said Letters Patent is hereby corrected as shown below:

On the Title Page, item [57] Abstract, line 14, delete the semicolon ";" and insert a comma --,--.

On the Cover Page, item [57] Abstract, line 16, between "gate" and "via" insert --electrode--.

Column 14, line 16, delete "tile" and insert --the--.

Signed and Sealed this

Fifth Day of November, 1996

Attest:

BRUCE LEHMAN

Attesting Officer    Commissioner of Patents and Trademarks